(12) United States Patent
Jensen et al.

(10) Patent No.: US 7,852,078 B2
(45) Date of Patent: Dec. 14, 2010

(54) METHOD, SYSTEM AND SOFTWARE ARRANGEMENT FOR MEASURING MAGNETIC FIELD CORRELATION

(75) Inventors: Jens Jensen, Scarsdale, NY (US);
Joseph A. Helpern, Cornwall, NY (US);
Glyn Johnson, New York, NY (US);
Ramesh Chandra, Ardsley, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 12/710,035

(22) Filed: Feb. 22, 2010

(65) Prior Publication Data
US 2010/0207626 A1    Aug. 19, 2010

Related U.S. Application Data (63) Continuation of application No. 10/564,697, filed as application No. PCT/US2004/022163 on Jul. 8, 2004, now Pat. No. 7,667,459.

(60) Provisional application No. 60/485,502, filed on Jul. 8, 2003.

(51) Int. Cl.
*G01V 3/00* (2006.01)
(52) U.S. Cl. ........................ 324/309; 324/307
(58) Field of Classification Search ......... 324/300–322; 600/407–445
See application file for complete search history.

(56) References Cited

U.S. PATENT DOCUMENTS

| | | | | |
|---|---|---|---|---|
| 6,049,205 | A * | 4/2000 | Taicher et al. ............... | 324/303 |
| 6,344,744 | B2 * | 2/2002 | Taicher et al. ............... | 324/303 |
| 6,441,613 | B1 | 8/2002 | Rosenfeld et al. | |
| 6,526,306 | B2 | 2/2003 | Johnson et al. | |
| 7,307,420 | B2 * | 12/2007 | Dumoulin ................... | 324/309 |
| 7,667,459 | B2 * | 2/2010 | Jensen et al. ................ | 324/309 |
| 2009/0179642 | A1 * | 7/2009 | deCharms ................... | 324/309 |
| 2010/0072994 | A1 * | 3/2010 | Lee et al. .................... | 324/307 |

OTHER PUBLICATIONS

International Search Report for International Application No. PCT/US2004/022163 filed Jul. 8, 2004.

International Written Opinion for International Applicatin No. PCT/US2004/022163 filed Jul. 8, 2004.

International Preliminary Report on Patentability for International Applicatin No. PCT/US2004/022163 filed Jul. 8, 2004.

Callaghan, Paul T., "Principles of Nuclear Magnetic Resonance Microscopy", Oxford University Press, New York, NY, 1991, Sections 7.6.4, pp. 413-416.

Rhodin, Johannes A. G., "Histology—A Text and Atlas", Oxford University Press, New York, NY 1974, pp. 314-318.

Dixon, W. Thomas., "Simple Proton Spectroscopic Imaging", Radiology 1984; 153; pp. 189-194.

(Continued)

*Primary Examiner*—Brij B Shrivastav
(74) *Attorney, Agent, or Firm*—Dorsey & Whitney LLP (57) ABSTRACT

Methods, systems, software arrangements and storage medium for measuring the magnetic field correlation function ("MFC"), and more particularly, to methods for measuring the magnetic field correlation function utilizing asymmetric spin echoes. Asymmetric Dual Spin Echo Sequences ("ADSE") and Echo Planar Imaging Asymmetric Dual Spin Echo Sequences ("EPI-ADSE") may be employed to apply multiple echoes to a sample and acquire data from which the MFC may be determined.

18 Claims, 5 Drawing Sheets

OTHER PUBLICATIONS

Brooks et al., "Relaxometry and Magnetometry of Ferritin", Magnetic Resonance in Medicine, 1998; 40; pp. 227-235.

Campeau et al., "Hippcampal Transverse Relaxation Times in Patients with Alzheimer Disease", Radiology 1997; 205; pp. 197-201.

Connor et al., "Cellular Distribution of Transferrin, Ferritin, and Iron in Normal and Aged Human Brains", Journal of Neuroscience Research, 1990; 27; pp. 595-611.

Ganesan et al., "New Technique for Obtaining NMR Linewidth Images of Lung and Other Inhomogeneously Broadened Systems", Journal of Magnetic Resonance (B), 1993; 102; pp. 293-298.

Gelman, Benjamin B., "Iron in CNS Disease", Journal of Neuroscience Research, 1995; 54; pp. 477-486.

Gerlach et al., "Altered Brain Metabolism of Iron as a Cause of Neurodegenerative Diseases?", Journal of Neurochemistry, 1994; 63; pp. 41-51.

Hallgren et al., "The Effect of Age on the Non-Haemin Iron in the Human Brain", Journal of Neurochemistry, 1958; 3; pp. 41-51.

Hoppel et al., "Measurement of regional Blood Oxygenation and Cerebral Hemodynamics", Magnetic Resonance in Medicine, 1993; 30; pp. 715-723.

Kennan et al., "Intravascular Susceptibility Contrast Mechanisms in Tissues", Magnetic Resonance in Medicine, 1994; 31; pp. 9-21.

Piñero et al., "Iron in the Brain: An Important Contributor in Normal and Diseased States", Neuroscientist, 2000; 6; pp. 435-453.

Rosenthal et al., "Magnetic Susceptibility Effects of Trabecular Bone on Magnetic Resonance Imaging of Bone Marrow", Investigative Radiology, 1990; 25; pp. 173-178.

Sepponen et al., "A Method for Chemical Shift Imaging: Demonstration of Bone Marrow Involvement with Proton Chemical Shift Imaging", Journal of Computer Assisted Tomography, 1984; 8; pp. 585-587.

Stables et al., "Asymmetric Spin-Echo Imaging of Magnetically Inhomogeneous Systems: Theory, Experiment, and Numerical Studies", Magnetic Resonance in Medicine, 1998; 40; pp. 432-442.

Szafer et al., "Theoretical Model for Water Diffusion in Tissues" Magnetic Resonance in Medicine, 1995; 33; pp. 697-712.

Thulborn et al., "The Role of Ferritin and Hemosiderin in the MR Appearance of Cerebral Hemorrhage: A Histopathologic Biochemical Study in Rats", American Journal of Neuroradiology; 1990; 11; pp. 291-297.

Vymazal et al., "The Relation Between Brain Iron and NMR Relaxation Times: An in Vitro Study", Magnetic Resonance in Medicine, 1996; 35; pp. 55-61.

Weisskoff et al., "Microscopic Susceptibility Variation and Transverse Relaxation: Theory and Experiment", Magnetic Resonance in Medicine, 1994; 31; pp. 601-610.

Wismer et al., "Susceptibility Induced MR Line Broadening: Applications to Brain Iron Mapping", Journal of Computer Assisted Tomography, 1988; 12; pp. 259-265.

Ye et al., "Estimation of Brain Iron In Vivo by Means of the Interecho Time Dependence of Image Contrast", Magnetic Resonance in Medicine, 1996b; 36; pp. 153-158.

Ye et al., "Estimation of the Iron Concentration in Excised Gray Matter by Means of Proton Relaxation Measurements", Magnetic Resonance in Medicine, 1996a; 35; pp. 285-289.

Anderson, P.W., "Exchange Narrowing in Paramagnetic Resonance", Reviews of Modern Physics, vol. 25, No. 1, Jan. 1952, pp. 269-276.

Jensen et al., "Strong Field Behavior of the NMR Signal From Magnetically Heterogeneous Tissues", Magnetic Resonance in Medicine, 43, 2000, pp. 226-236.

Jensen et al., "NMR Relaxation in Tissues with Weak Magnetic Inhomogeneities", Magnetic Resonance in Medicine, 44, 2000, pp. 144-156.

Jensen et al., "Quantitative Model for the Interecho Time Dependence of the CPMG Relaxation Rate in Iron-Rich Gray Matter", Magnetic Resonance in Medicine, 46, 2001, pp. 159-165.

Jensen et al., "Method for Measuring the Magnetic Field Corrlation Function for Water Protons in Biological Tissues", Proc. Intl. Soc. Mag. Reson. Med. 10, 2002.

* cited by examiner (a)

METHOD, SYSTEM AND SOFTWARE ARRANGEMENT FOR MEASURING MAGNETIC FIELD CORRELATION

CROSS-REFERENCE TO RELATED APPLICATIONS

The present application is a continuation of U.S. patent application Ser. No. 10/564,697 filed Jan. 11, 2006 now U.S. Pat. No. 7,667,459 (the "697 Application"), which is U.S. National Phase of PCT Application No. PCT/US2004/022163 which was filed on Jul. 8, 2004 and published in English on Jan. 27, 2005 as International Publication No. WO 2005/008259 (the "International Application"). The present application also claims priority from U.S. Patent Application No. 60/485,502, filed Jul. 8, 2003 (the "'502 Application"). The entire disclosures of these applications are incorporated herein by reference. This application claims priority from the '697 Application pursuant to 35 U.S.C. §120, from the International Application pursuant to 35 U.S.C. §365, and from the '502 Application pursuant to 35 U.S.C. §§119(e) and 365.

FIELD OF THE INVENTION

The present invention relates to methods, systems, software arrangements and storage medium for measuring a magnetic field correlation function in a magnetic resonance imaging area, and more particularly, to methods for measuring the magnetic field correlation ("MFC") function utilizing asymmetric spin echoes.

BACKGROUND OF THE INVENTION

A theory of using asymmetric spin echoes is described, in part, in Jensen J. H. et al. Chandra R. *Magn Reson Med;* 44:144 (2000) (the "Jensen Publication"), the entire disclosure of which is incorporated herein by reference.

The local magnetic field experienced by a water proton is quantitatively characterized by the magnetic field correlation function, K(t), which may be defined by $$K(|t-t'|) = \langle B(t)B(t') \rangle, \quad [1]$$

with B(t) being the difference, at a time t, between the magnitude of the local field and the magnitude of the spatially uniform main field, $B_0$, and with the angle brackets indicating an averaging over all the water protons within a given region of interest. K(t) may depend on both the spatial distribution of the magnetic field inhomogeneities and the diffusional dynamics of water molecules. The magnetic field correlation function provides information beyond the information contained in the standard nuclear magnetic resonance ("NMR") relaxation times. Thus, the present invention provides a novel technique to, inter alia, examine the properties of tissue, blood, iron-rich regions of the brain, and tumors.

Although it is believed that the MFC has not been specifically measured, it was introduced at least as early as 1953 in the seminal work of Anderson and Weiss on NMR line shapes. See Anderson P W, Weiss P R, Rev Mod Phys 1953; I25:269-276 (the "Anderson Publication"), the entire disclosure of which is incorporated herein by reference. More recently, it has been utilized in several studies on the modeling of MRI contrast. For example, see Callaghan P T, Oxford University Press, New York, 1991; (the "Callaghan Publication") Kennan et al., Magn Reson Med 1994; I31:9-21 (the "Kennan Publication"); Stables et al., Magn Reson Med 1998; I40:432-442 (the "Stables Publication"); and the Jensen Publication et al., the entire disclosures of which are incorporated herein by reference.

The MFC may be described as the magnetic resonance ("MR") signal intensity as a function of the acquisition time, and can be approximated by the exponential form:

$$K(t) = K_0 \exp(-t/\tau), \quad [2]$$

where $K_0 = K(0)$ is the magnetic field variance and τ is a characteristic decay time. It has recently been shown in the Jensen Publication, that when water diffusion is only weakly restricted the MFC is more accurately described by an algebraic expression of the form:

$$K(t) = K_0 \left(1 + \frac{t}{\tau}\right)^{-3/2}. \quad [3]$$

There is not a significant amount of quantitative information regarding the MFC, except for an exact result that can be derived for an idealized random sphere model.

Asymmetric single spin echoes were first introduced by Dixon and Sepponen. In particular, Dixon demonstrated how asymmetric spin echoes can be used to separate the MR signals originating from water and fat. See Dixon W T, Radiology 1984; I153:189-194 (the "Dixon Publication"), the entire disclosure of which is incorporated herein by reference. Sepponen et al., applied asymmetric spin echoes to obtain chemical shift images. See Sepponen R E, et al., Comput. Assist. Tomography 1984; I8:585-587 (the "Sepponen Publication"), the entire disclosure of which is incorporated herein by reference. The asymmetry of the Dixon sequence arises by shifting the signal acquisition time, while the asymmetry of the sequence of Sepponen et al. is achieved by shifting the 180° refocusing pulse.

Asymmetric single spin echo technique with a shifted refocusing pulse has been previously used to obtain MFC data. See Wismer et al., J Comput Assist Tomography 1988; I12: 259-265 (the "Wismer Publication"); Rosenthal et al., Invest Radiology 1990; I025:173-178 (the "Rosenthal Publication"); Thulborn et al., Am J Neuroradiol. 1990 (the "Thulborn Publication"); 11:291-297; Hoppel et al., Magn Reson Med 1993; I30:715-723 (the "Hoppel Publication"); Ganesan et al., J. Magn. Reson. (B) 1993; I102:293-298 (the "Ganesan Publication"); and the Stables Publication, the entire disclosures of which are incorporated herein by reference. However, there remains a need for improved methods of measuring the magnetic field correlation.

SUMMARY OF THE INVENTION

The present invention relates to methods, systems, software arrangements and storage medium for measuring the magnetic field correlation function, and more particularly, to methods, systems, software arrangements and storage medium measuring the magnetic field correlation function utilizing asymmetric spin echoes.

In an exemplary embodiment of the present invention, method, systems, software arrangements and storage medium obtaining the magnetic field correlation ("MFC") of a sample using magnetic resonance for imaging ("MRI") are provided that apply multiple spin echo sequences in which at least one spin echo sequence is an asymmetric spin echo sequence. Resultant information may then be acquired and the MFC can be determined as a function of the acquired information.

In a further exemplary embodiment of the present invention, the spin echo sequences may be an Asymmetric Dual Spin Echo Sequence ("ADSE") having multiple echoes. In another exemplary embodiment of the present invention, the spin echo sequences may be an Echo Planar Imaging-Asymmetric Dual Spin Echo Sequence ("EPI-ADSE") having multiple echoes.

In a further embodiment of the present invention, the asymmetric spin echo sequence can be applied by shifting a refocusing pulse such that the time between the rotation pulse and the refocusing pulse ($t_1$) is not equal to the time between the refocusing pulse and the signal acquisition ($t_2$), e.g., $t_1 \neq t_2$. In yet another exemplary embodiment, the asymmetric spin echo sequence may be applied by shifting the acquisition of the resultant information such that the time between the rotation pulse and the refocusing pulse ($t_1$) is not equal to the time between the refocusing pulse and the signal acquisition ($t_2$), i.e., $t_1 \neq t_2$.

In a further exemplary embodiment, the MFC can be determined as a function of the resultant information by applying the formula $$K[(2n-1)\Delta t] \approx \frac{(-1)^{n+1}}{2\gamma^2 t_s^2} \ln\left[\frac{S_n(0)S_{n-1}(t_s)}{S_n(t_s)S_{n-1}(0)}\right],$$

in which $\gamma$ is the proton gyromagnetic ratio, $S_n$ is the signal intensity of the nth echo; and $t_s = |t_1 - t_2|$ with $t_1$ being the time between a rotation pulse and a refocusing pulse, and $t_2$ being the time between the refocusing pulse and a signal acquisition.

Other and further objects, features and advantages of the present invention will be readily apparent to those skilled in the art upon a reading of the description of preferred embodiments which follows.

DETAILED DESCRIPTION OF THE PREFERRED EMBODIMENTS

The present invention relates to methods, systems, software arrangements and storage medium for measuring the MFC function, and more particularly, to methods, software arrangements and storage medium for measuring the MFC function utilizing asymmetric spin echoes.

Since the MFC is sensitive to the spatial distribution of microscopic magnetic field inhomogeneities, MFC imaging enables another way to probe tissue microstructures. For example, MFC imaging may be potentially useful for evaluating tissues with substantial intrinsic microscopic magnetic susceptibility variations. It may therefore be used as a sensitive probe of tissue microstructure that provides certain information beyond what is contained in the standard nuclear magnetic resonance ("NMR") relaxation times, such as T2 and T2*. In addition, microscopic susceptibility variations can be created by the introduction of a contrast agent. For example, the contrast agent may be a paramagnetic element, e.g., gadopentetate dimeglumine (Gd-DTPA). Therefore, the imaging of the MFC may be useful in the evaluation of neurodegenerative disorders, such as Parkinson's and Alzheimer's diseases, since ferritin (i.e., the most prevalent form of iron in the brain) is paramagnetic and localized in oligodendrocytes, which have diameters of about 7 μm. Indeed, it is known that the T2 relaxation rate, as measured with a Carr-Purrcell-Meiboom-Gill (CPMG) sequence, depends significantly on the interecho time in the brain region. Thus, the MFC with a nontrivial time dependence may be expected and the measurement of this time dependent MFC can provide a significant marker of disease state.

The MFC imaging may be of particular interest for Alzheimer's disease, as conventional relaxation time measurements may not be as useful. Another possibly important application the MFC imaging may be to the imaging of tumors. Most paramagnetic contrast agents, such as Gd-DTPA, enter only the extra cellular spaces of tissues, and thereby create microscopic magnetic susceptibility variations. The MFC of a contrast agent infused tumor may be sensitive to tumor morphology (e.g., cell size and density). The measurement of the MFC can therefore assist in tumor identification and grading. Moreover, measuring the MFC with the magnetic resonance imaging ("MRI") may be a preferable way for probing inhomogeneities on a length scale of a few tens of micrometers. This may be because MRI echo times are typically in the range of 10 ms to 100 ms, and the water diffusion constant in biological tissues is about 1.0 μm²/ms. This implies that the temporal behavior of the measured MFC may be sensitive to spatial variations in the range of 8 μm to 25 μm. Biologically, this may be an important length scale, since this is the size of capillaries and many types of cells.

The MFC may be defined as the product of the magnetic field shifts experienced by a water molecule at two different times, averaged over all the water molecules within a specified region of interest. The field shifts may be the differences between the magnitude of the field and the magnitude of the uniform background field (which may be nearly the same as the external field magnitude). If the biological tissue has linear magnetic characteristics, as is usually the case, then the MFC may vary as the square of the external field. The dependence of the MFC on the difference in the two sampling times, on the other hand, may be purely an intrinsic tissue property. In practice, the MFC may be most sensitive to the spatial dependence of the field shifts over length scales of about 10 μm, which is comparable to the size of many cell types.

To appreciate the significance of the MFC, it is preferable to understand the definition of the MFC, which is provided as follows. For example, a tissue may be exposed to a strong, uniform external magnetic field, as is the case in a typical MRI experiment. Because of spatial variations in its magnetic susceptibility, the tissue may generate an inhomogeneous secondary field. The susceptibility variations can be provided due to structures such as iron-rich cells or vessels with a deoxygenated blood. A water molecule diffusing through the tissue may experience a field that varies with time due to field inhomogeneities. If $\delta B(t)$ is defined as the difference at time t between the magnitude of the field at the water molecule and the uniform background field, then the MFC may be defined by $$K(|t-t'|) = \langle \delta B(t) \delta B(t') \rangle, \qquad [4]$$

where the angle brackets indicate an average over all the water molecules in a specified region of interest (in practice this may be an MRI voxel). The temporal behavior of the MFC, which is indicated with a symbol K in mathematical expressions, involves the time difference $|t-t'|$ as follows from an assumption that the state of the tissue may be time invariant. It should be noted that, by definition, the MFC can depend quadratically on the magnitude of the field inhomogeneities.

Figure 1:
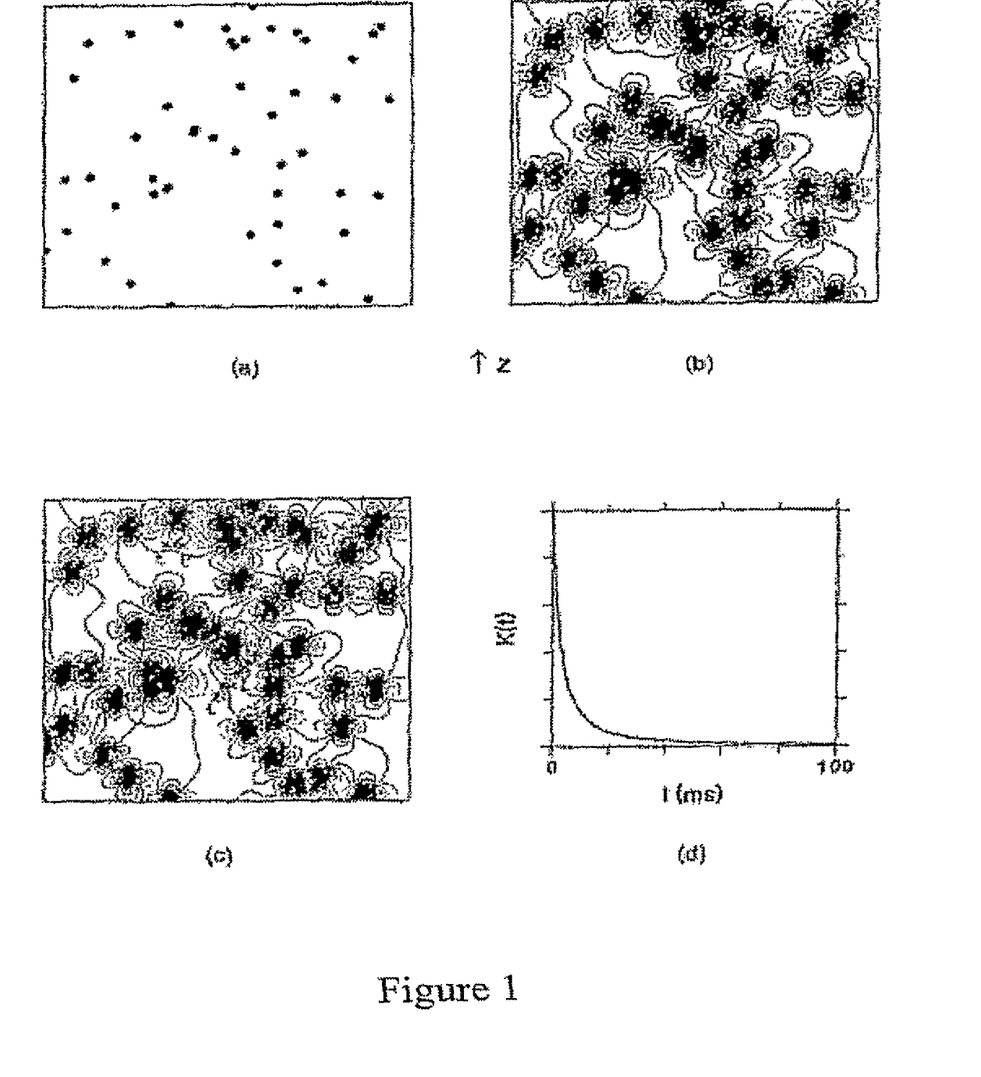
FIG. 1(a) shows an exemplary illustration of randomly distributed spheres representing cells with a higher magnetic susceptibility then the surrounding tissue.
FIG. 1(b) shows exemplary contour lines for the magnetic field shifts induced by an external field oriented in the z direction, with solid lines provided for positive shifts, and dotted lines provided for negative shifts.
FIG. 1(c) shows diffusion paths for two water molecules beginning at a time t and ending at a time t'.
FIG. 1(d) shows an illustration of an exemplary magnetic field correlation ("MFC") as a function of time representing a decay of the field shift correlation.

As an illustration, FIG. 1(a) depicts an exemplary set of approximately identical spheres distributed randomly in space. The random spheres may serve, for example, as models for iron-rich glial cells as described in Jensen J H, et al., Magn Reson Med 2001; I46:159-165 (the "Second Jensen Publication"), the entire disclosure of which is incorporated herein by reference. For example, the magnetic susceptibility of the spheres may be higher than that of the surrounding media, and a uniform magnetic field is applied in the z direction. An inhomogeneous secondary magnetic field (FIG. 1(b)) can then be generated. FIG. 1(c) depicts an exemplary diffusion path of two water molecules. For example, diffusion paths for two water molecules beginning at a time t and ending at a time t'. When $|t-t'|$ is small, the diffusion path is short, and the initial and final field shifts are strongly correlated. When $|t-t'|$ is large the diffusion path is long and the initial and final field shifts are weekly correlated. For the shorter path, which corresponds to a smaller time difference between the initial and final points, the initial and final magnetic field shifts are similar, indicating a high degree of correlation. For the longer path, the magnetic field shifts are different, indicating a low degree of correlation. FIG. 1(d) plots the corresponding decay of the MFC as a function of time.

According to one exemplary embodiment according to the present invention, the MFC at specific times can be directly imaged without recourse to any particular model. This exemplary technique thereby yield information beyond what may be provided by conventional relaxation time measurements. The fact that the MFC contains information distinct from T2 and T2* can be described using the following simple example. For example, two test tubes, A and B, can be provided each containing an aqueous suspension of microspheres and equal concentrations of a paramagnetic contrast agent. If the microspheres in test tube A have a radius of 10 μm and the microspheres in test tube B have a radius of 20 μm, the spatial density of spheres in test tube A can be eight times higher than in test tube B. The volume fraction filled by the spheres can then be approximately the same in both suspensions. T2 can be the same for both test tubes because T2 can be determined primarily by the contrast agent concentration. T2* can also be essentially the same, because T2* may depend primarily on the contrast agent concentration and the volume fraction of the spheres. Therefore, the test tubes may appear approximately identically on T2 or T2* weighted images. However, if a water diffusion constant of $1.0 \, \mu m^2/ms$ is assumed, then for a time difference of 20 ms the MFC values for the two test tubes will differ by about a factor of two, and the test tubes may appear sharply different on an MFC image.

A relationship between the MFC and transverse relaxation rates may be most clearly revealed through a connection between the MFC and T2 as measured with a Carr-Purcell-Meiboom-Gill (CPMG) sequence. Because of water diffusion through field gradients, the measured T2, as obtained from a monoexponential fit to the echo intensities, may depend on the interecho time, $2\Delta t$. In the limit $2\Delta t \to 0$, the true T2 value may be obtained. If the magnetic field inhomogeneities are not too large, then one can show that T2 as a function of $\Delta t$ may be provided by $$\frac{1}{T2(\Delta t)} = \frac{1}{T2(0)} + \frac{8\gamma^2}{\pi^2} \sum_{m=0}^{\infty} \frac{1}{(2m+1)^2} \int_0^\infty dt K(t) \cos\left[\frac{(2m+1)\pi t}{2\Delta t}\right], \qquad [5]$$

with γ representing the proton gyromagnetic ratio.

If the full dependence of T2 on the interecho time were available, then it is possible to invert Eq. [5] to determine the MFC. However, it is generally only practical to obtain T2 for a limited number of $\Delta t$ values, and so a straightforward inversion may not be possible. In some cases, it may be possible to postulate a model form for the MFC, having a few adjustable parameters, and then fit the model to the T2 data by using equation [5]. However, the success of this approach may depend on the accuracy of the model, which can be difficult to establish.

The physical significance of the MFC can be twofold. First, the magnitude of the MFC may provide a measure of the amplitude of the magnetic field inhomogeneities within a tissue. In particular, as follows from Eq. [3], K(0) can be the variance of the field. Second, the decay of the MFC with time may contain information about the spatial variation of the field inhomogeneities. In particular, the temporal rate of change of the MFC at a time t (i.e., K'(t)) can be primarily sensitive to field inhomogeneities with a length scale of about $\sqrt{6Dt}$, where D is the water diffusion constant, where $\sqrt{6Dt}$ being the average distance a water molecule diffuses over a time t. Thus, the MFC may be measured in conjunction with diffusion-weighted imaging (DWI) in order to obtain an estimate of the water diffusion constant. This additional information may then allow for a more accurate assessment of the length scale associated with the field inhomogeneities. If the inhomogeneities vary only on length scales that are large compared to about $\sqrt{6Dt}$ (i.e., >>25 μm), the MFC can be essentially independent of time and may be related to the NMR line width. Particularly, the second moment of the NMR spectral line may be approximately about $4\gamma^2 K$.

Figure 2:
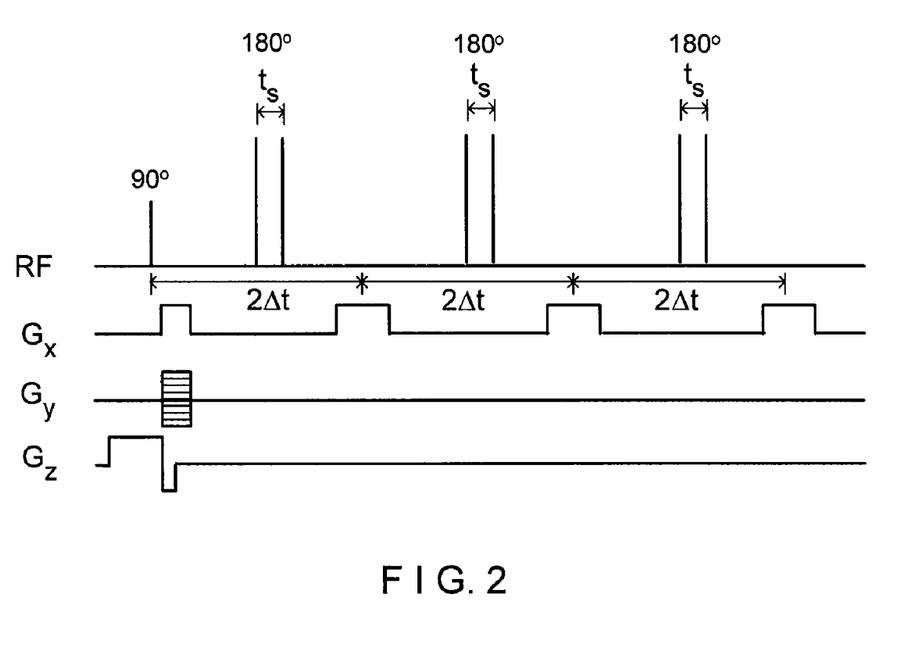
FIG. 2 shows an exemplary asymmetric Carr-Purrcell-Meiboom-Gill (CPMG) sequence with N=3.

According to an exemplary embodiment of the present invention, the MFC may be determined by applying 2 or more spin echo sequences, in which at least one spin echo sequence is an asymmetric spin echo sequence. FIG. 2 shows an exemplary asymmetric Carr-Purrcell-Meiboom-Gill (CPMG) sequence with N=3. The 180° refocusing pulses are shifted by a time $t_s$ while the acquisition time is unchanged. According to one exemplary embodiment of the present invention, a spin echo sequence can be provided in which an initial 90° rotation pulse may be followed at a time $t_p$ by a 180° refocusing pulse and an NMR signal of magnitude $S(t, t_p)$ is collected at a time t. For standard spin echo imaging, t can be selected to be equal to $2t_p$. Thus, an asymmetric spin echo image may have about $t \neq 2t_p$ and the following formula may be applied:

$$\ln\left[\frac{S(2t, t)}{S(2t, t+t_s)}\right] \approx 2\gamma^2 \int_{t_s}^{t_s} dt'(t_s - |t'|K(t+t'), \quad [6]$$

where $\gamma$ is the proton gyromagnetic ratio.

Equation [6] is based on a weak field approximation, but is also usable at clinical field levels of a few Tesla or less. The correlation function enters equation [6] preferably only for times between t−ts and t+ts. If K(t) is approximated in this temporal range by a linear function, the following formula may be applied:

$$\frac{1}{2\gamma^2 t_s^2} \ln\left[\frac{S(2t, t)}{S(2t, t+t_s)}\right] \approx K(t). \quad [7]$$

Hence, the ratio of the signal intensities for a standard spin echo sequence and for an asymmetric spin echo sequence can be used to estimate K(t) at a selected time. This exemplary technique may be utilized for multiple spin echo sequences so that K(t) at several different times may be determined from one pair of acquisitions.

For example, the key may be a relationship between the MFC and the signal intensity for an asymmetric CPMG sequence. The asymmetric CPMG sequence differs from a conventional CPMG sequence in that the 180° refocusing pulses are shifted from their usual times by an amount $t_s$, as is illustrated in FIG. 2. Regardless of $t_s$, the signal can be sampled at times $2n\Delta t$, for n=1, 2, ..., N, where $2\Delta t$ is the interecho time and N is the total number of echoes. Now let $S_n(t_s)$ be the magnitude of the nth echo.

$$\int_{-t_s}^{t_s} dt(t_s - |t|)K[(t+2n-1)\Delta t] \approx \frac{(-1)^{n+1}}{2\gamma^2} \ln\left[\frac{S_n(0)S_{n-1}(t_s)}{S_n(t_s)S_{n-1}(0)}\right], \quad [8]$$

with the convention $S_{-1}(ts)=1$. The corrections to equation [8] are preferably third order in the field, and for weak fields are small compared to the MFC, which is second order in the field. The integral in equation [8] is over the time t ranging from $-t_s$ to $t_s$. As long as $t_s$ is not too large, it is reasonable to make the following linear approximation:

$$K[(t+2n-1)\Delta t] \approx K[(2n-1)\Delta t] + tK'[(2n-1)\Delta t] \quad [9]$$

which leads to the following simplification:

$$K[(2n-1)\Delta t] \approx \frac{(-1)^{n+1}}{2\gamma^2 t_s^2} \ln\left[\frac{S_n(0)S_{n-1}(t_s)}{S_n(t_s)S_{n-1}(0)}\right], \quad [10]$$

This expression indicates that the MFC at the time of the nth refocusing pulse can be estimated from the signal intensities of the preceding and succeeding echoes. As provided in equation [10], an echo train of N echoes can be used to obtain the MFC at N different times.

Figure 3:
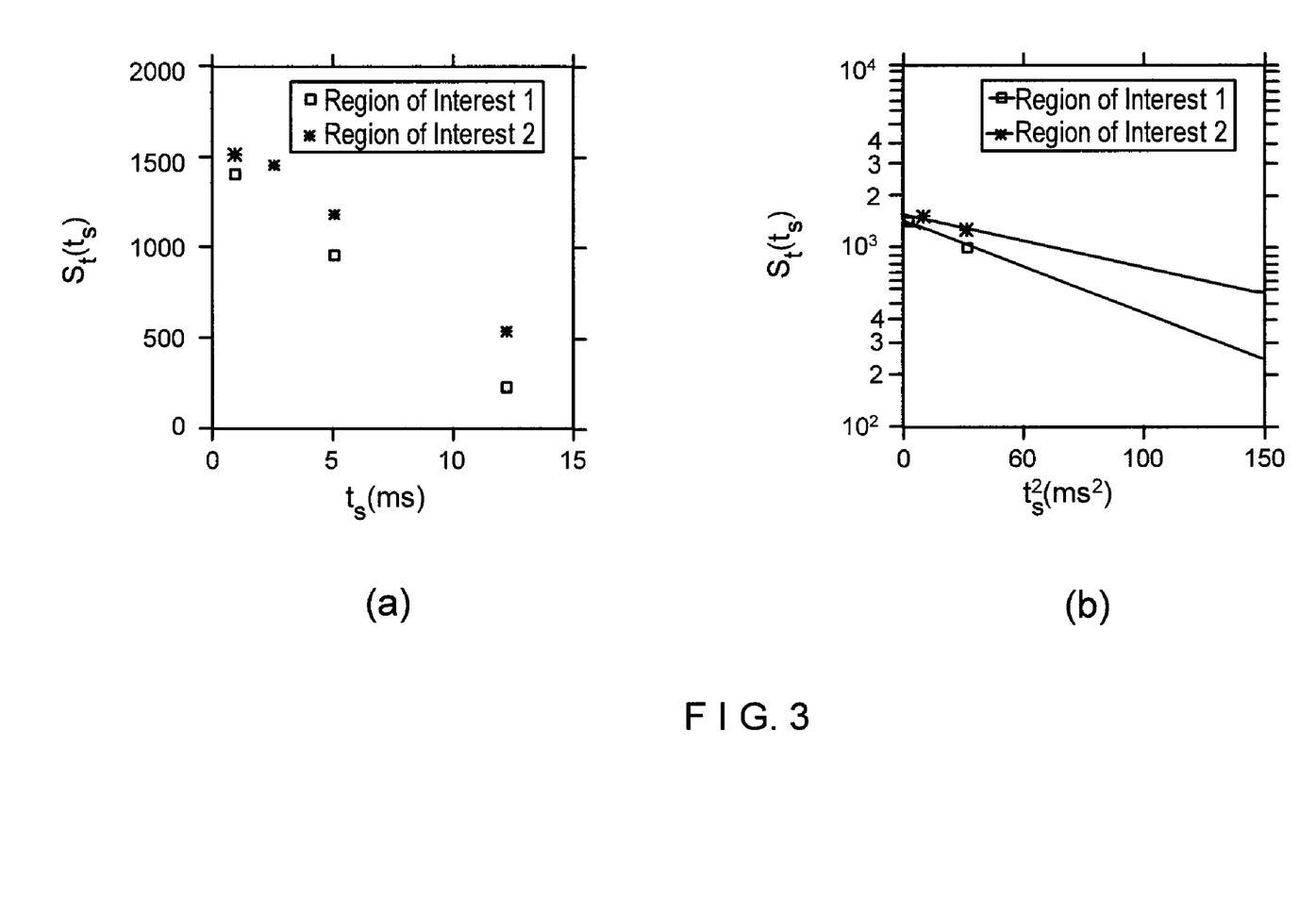
FIG. 3(a) shows an exemplary asymmetric spin echo signal intensity provided as a function of the refocusing pulse time shift for two regions of interest within a subacute hemorrhagic brain lesion.
FIG. 3(b) shows an exemplary semi-logarithmic graph provided as a function of the square of the time shift

As an example of how to apply equation [10] to obtain an estimate for the MFC, the experiment described in Wismer may be considered. See Wismer et al., J Comput Assist Tomography 1988; I12:259-265, the entire disclosure of which is incorporated herein by reference. FIG. 3a shows the signal intensity from a subacute hemorrhagic brain lesion obtained in vivo with asymmetric spin echoes. The field level was 0.6 T, the TE may be 50 ms, and the TR may be 500 ms. For n=1, Eq. [10] can be expressed as $$\ln[S_1(t_s)] \approx \ln[S_1(0)] - 2\gamma^2 t_s^2 K(\Delta t). \quad [11]$$

Thus, the signal intensity is preferably a linear function of $t_s^2$ on a semi-logarithmic plot. An estimate of the MFC at the time of the refocusing pulse can then be found from the slope of a line fitted to the data. In FIG. 3b, the same data shown in FIG. 3a is replotted as a function of $t_s^2$. The slope of a linear fit to the data allowing an estimate of the MFC at a time of 25 ms. From the slope of the linear fit, it is indicated that $\gamma^2 K(25$ ms)=6100±200 s$^{-2}$, for the first region of interest, and $\gamma^2 K(25$ ms)=3400±100 s$^{-2}$, for the second region of interest. (When giving quantitative values for the MFC, a factor of $\gamma^2$ is included for convenience.)

Qualitatively similar behavior for the signal intensity as a function of $t_s$ has been reported for normal brain, bone marrow, lung tissue and microsphere phantoms. See the Hoppel, Rosenthal, Ganesan., and Stables Publications.

Referring to FIG. 2, the RF (i.e., radio frequency) pulses, X magnetic gradient, Y magnetic gradient, and Z magnetic gradient are plotted against time. An initial magnetic field polarizes the molecules in the Z direction. A 90 degree rotation pulse can then be used to move the magnetization into the XY plane, which precesses about the Z direction. A 180 degree refocusing pulse may then be used to correct a phase dispersion. Additional refocusing pulses may also be used to increase the signal, and further correct the phase dispersion. In an exemplary embodiment of the present invention, at least two refocusing pulses may be used. In a further embodiment, the gradient coils can be energized at various times to produce an image of the subject being analyzed.

One of the features of the present invention is the use of the RF pulse sequence. Referring to FIG. 2, the dotted line shown therein represents the typical time that a refocusing pulse is used in conventional systems. This is approximately provided between the time of the rotation pulse and the time the signal is acquired. In an exemplary aspect of the present invention, the radio frequency pulse can be shifted by time $t_s$. The imaging signal changes as the pulse is shifted either positively or negatively. In a further exemplary embodiment, the refocusing pulse may be shifted in one direction up to the point where it is approximately simultaneous with the 90 degree pulse. In another embodiment of the present invention the refocusing pulse may be shifted by an amount up to the point where it is nearly simultaneous with the signal acquisition. In yet another exemplary embodiment of the present invention, the refocusing pulse may be shifted back and forth arbitrarily within that region. In still another embodiment of the present invention, the refocusing pulse may be shifted about ¼ of the time between the previous pulse and the time the signal is obtained.

According to one exemplary embodiment of the present invention, two pulse sequence programs implementing an ADSE may be used. A dual spin echo has the advantage over a single spin echo by simultaneously providing the information usable to estimate the MFC for two different time values.

In one exemplary embodiment of the present invention, a conventional sequence with a single phase encoding step for each 90° radio frequency (RF) pulse may be used. For example, the sequence shown in FIG. 2 may be utilized, with only two 180° pulses. In another exemplary embodiment of the present invention, an EPI dual spin echo in which all of phase space can be acquired with a single 90° pulse. Since the image acquisition time is a fraction of a second for the EPI sequence, as compared to several minutes for the conventional sequence, the EPI sequence may be more convenient for some applications. In addition, the EPI sequence may reduce associated motion artifacts.

Using the exemplary techniques described in the present invention, the MFC may be estimated by applying equation [7] to the ADSE imaging data. For example, typical MFC values obtained in vivo for a human brain are using the methods and systems according to the present invention listed in Table 1. One prior in vivo human study, which allows for MFC estimates, gives data just for hemorrhagic brain lesions, which have a much higher MFC than healthy brain tissue. See Wismer Publication. This study, however, has been performed at a low field level of 0.6 T, and the MFC in normal brain was presumably too small to observe due to a small SNR. Since the MFC increases quadratically with the field strength, the MFC at 1.5 T is 6.25 times larger than at 0.6 T, its detection is easier.

TABLE 1

| Brain Region | Mean MFC ($1/s^2$) |
|---|---|
| Globus Pallidus | 1004 ± 112 |
| Substania Nigra | 820 ± 92 |
| Red Nucleus | 715 ± 75 |
| Putamen | 497 ± 83 |
| Caudate Head | 443 ± 73 |
| Thalamus | 318 ± 100 |
| Cortical Gray Matter | 268 ± 95 |
| Frontal White Matter | 150 ± 104 |

Figure 4:
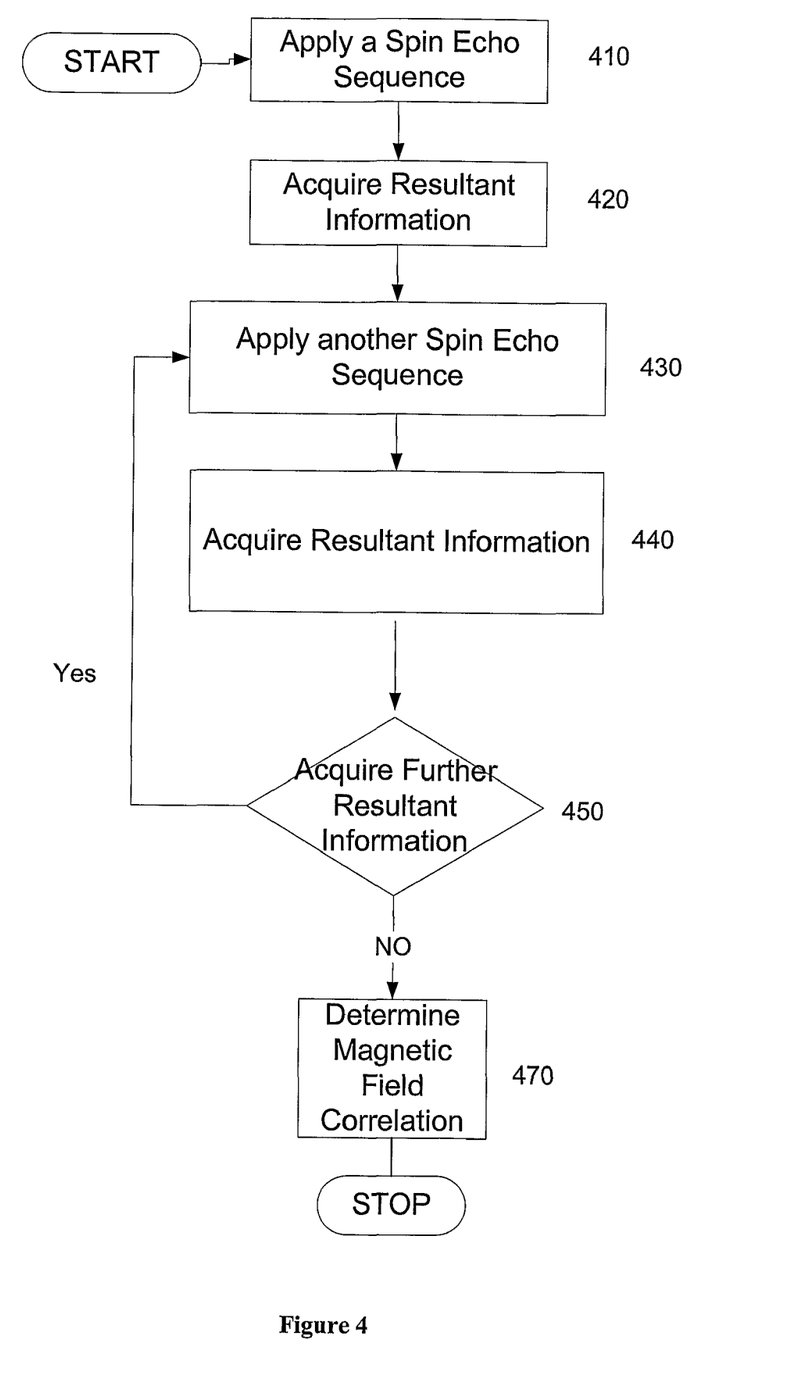
FIG. 4 shows a flow diagram representing an exemplary method and procedure under at least partial control of a computing arrangement of FIG. 5 using the methods and systems of the present invention.
Figure 5:
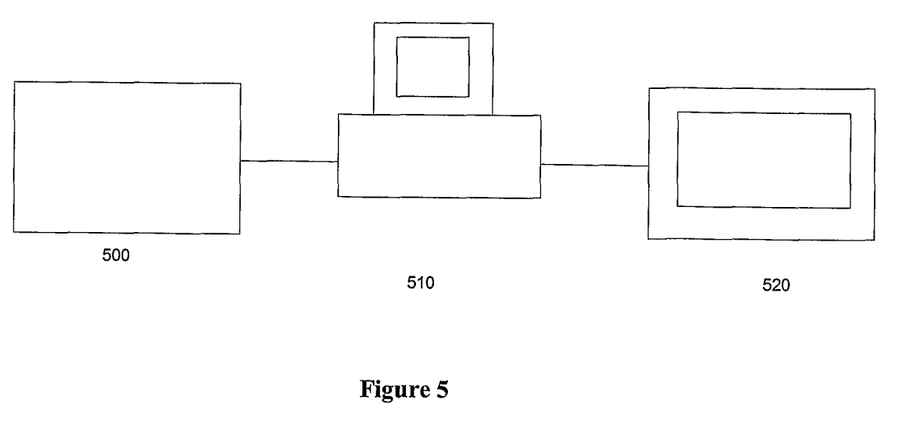
FIG. 5 shows a schematic block diagram of an exemplary embodiment of a system according to the present invention.

FIG. 4 is a flow diagram representing an exemplary procedure under at least partial computer control using the methods and systems of the present invention, as may be carried out by the system of FIG. 5. In step 410, a spin echo sequence is applied to the sample. Next, the corresponding resultant information is acquired in step 420. In step 430, another spin echo sequence is applied to the sample. Then, in step 440 resultant information is acquired corresponding to the spin echo sequence applied in step 430. In step 450, it is determined whether it is desirable to apply more spin echo sequences to the sample. If yes, additional spin echo sequences are applied and corresponding resultant information is further acquired. If no, the magnetic field correlation is determined based on the acquired resultant information. It should be noted that according to an exemplary embodiment of the present invention at least one spin echo sequence is an asymmetric spin echo sequence.

FIG. 5 shows a schematic block diagram of an exemplary embodiment of a system according to the present invention. In particular, an MRI instrument 500 is controlled by a processing arrangement 510 and may be connected to an output display 520. The processing arrangement may control the spin-echo sequences applied to the sample located in the MRI instrument 500 and also obtain the resultant information from the sample. The processing arrangement 510 may also be used to calculate the magnetic field correlation. In a further embodiment, the processing arrangement 510 may be used to generate an image as a function of the determined MFC, which may then be displayed on output display 520.

Therefore, the exemplary embodiment of the system process and software arrangement according to the present invention is well-adapted to carry out the objects and attain the ends and advantages mentioned as well as those which are inherent therein. While the invention has been depicted, described, and is defined by reference to exemplary embodiments of the invention, such a reference does not imply a limitation on the invention, and no such limitation is to be inferred. The invention is capable of considerable modification, alteration, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalence in all respects.

The invention claimed is:

1. A system for determining data associated with magnetic field shifts of a sample using magnetic resonance ("MR") imaging, comprising:
   a storage medium which includes software that is capable of being executed to perform procedures comprising:
      causing an application of two or more MR pulse sequences to the sample to obtain a resultant information, and
      determining magnetic field correlation data as a function of the resultant information,
   wherein the magnetic field correlation data relates to a product of the magnetic field shifts that are experienced by molecules of the sample at least two different times, and averaged over a particular region of interest of the molecules.

2. The system according to claim 1, wherein the product of the magnetic field shifts is averaged within the particular region of interest.

3. The system according to claim 1, wherein the molecules are water molecules.

4. The system according to claim 1, wherein at least one of the MR pulse sequences is a spin echo sequence.

5. The system according to claim 4, wherein the spin echo sequence is applied by shifting a refocusing pulse that is applied to the sample, and wherein a first time between a rotation pulse that is applied to the sample and the refocusing pulse is not equal to a second time which is between the application of the refocusing pulse and when the resultant information is obtained.

6. The system according to claim 4, wherein the spin echo sequence includes an Asymmetric Dual Spin Echo Sequence (ADSE) having multiple echoes.

7. The system according to claim 4, wherein the spin echo sequence includes an Echo Planar Imaging-Asymmetric Dual Spin Echo Sequence (EPI-ADSE) having multiple echoes.

8. The system according to claim 1,
   wherein the magnetic field shifts are determined as a function of the resultant information by applying the formula $$K[(2n-1)\Delta t] \approx \frac{(-1)^{n+1}}{2\gamma^2 t_s^2} \ln\left[\frac{S_n(0)S_{n-1}(t_s)}{S_n(t_s)S_{n-1}(0)}\right],$$

wherein γ is the proton gyromagnetic ratio, $S_n$ is the signal intensity of the nth echo; $t_s=|t_1-t_2|$, where t1 is the time between a rotation pulse that is applied to the sample and a refocusing pulse that is applied to the sample and t2 is the time between a refocusing pulse and when the resultant information is obtained.

9. The system according to claim 1, wherein the software is further capable of causing a generation of an image as a function of the determined magnetic field shifts.

10. The system according to claim 1, wherein the software is further capable of causing a determination of a distribution of a paramagnetic element in the sample as a function of the determined magnetic field shifts.

11. The system according to claim 1, wherein the software is further capable of causing a determination of a distribution of iron in the sample as a function of the determined magnetic field shifts.

12. The system according to claim 1, wherein the software is further capable of causing an addition of a contrast agent to the sample prior to applying the MR pulse sequences.

13. The system according to claim 12, wherein the contrast agent is gadopentetate dimeglumine ("Gd-DTPA").

14. The system according to claim 1, wherein the software is further capable of causing an a classification of a tumor in the sample.

15. The system according to claim 5, wherein the rotation pulse is a 90 degree radio frequency ("RF") excitation pulse.

16. The system according to claim 5, wherein the refocusing pulse is a 180 degree radio frequency ("RF") pulse.

17. The system according to claim 4, wherein the spin echo sequence is asymmetric, and is applied by shifting a refocusing pulse that is applied to the sample.

18. A software arrangement which, when executed on a processing device, configures the processing device to determine data associated with magnetic field shifts of a sample using magnetic resonance ("MR") imaging, the software arrangement comprising a set of instructions which when executed by the processing device, performs procedures comprising:

causing an application of two or more MR pulse sequences to the sample to obtain a resultant information; and determining magnetic field correlation data as a function of the resultant information, wherein the magnetic field correlation data relates to a product of the magnetic field shifts that are experienced by molecules of the sample at least two different times, and averaged over a particular region of interest of the molecules.

* * * * *